US008892374B2

(12) United States Patent
Gullbrand et al.

(10) Patent No.: US 8,892,374 B2
(45) Date of Patent: Nov. 18, 2014

(54) IDENTIFYING ELECTRICAL SOURCES OF ACOUSTIC NOISE

(75) Inventors: Jessica Gullbrand, Forest Grove, OR (US); Willem M. Beltman, West Linn, OR (US); Karthik Sankaranarayanan, Hillsboro, OR (US); Jose A. Cordova, Tiaquepaque (MX); Carlos A. Lopez, Guadalajara (MX); Eric Baugh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 732 days.

(21) Appl. No.: 13/175,269

(22) Filed: Jul. 1, 2011

(65) Prior Publication Data

US 2013/0006550 A1    Jan. 3, 2013

(51) Int. Cl.
| | | |
|---|---|---|
| G06F 11/30 | (2006.01) | |
| G01R 23/00 | (2006.01) | |
| G01R 31/00 | (2006.01) | |
| G01H 17/00 | (2006.01) | |
| G06F 19/00 | (2011.01) | |
| G06F 17/40 | (2006.01) | |
| G01H 3/04 | (2006.01) | |

(52) U.S. Cl.
CPC .................. *G01H 3/04* (2013.01); *G01H 17/00* (2013.01); *G01R 23/00* (2013.01); *G01R 31/00* (2013.01); *G06F 11/30* (2013.01); *G06F 19/00* (2013.01); *G06F 17/40* (2013.01)
USPC ................... 702/56; 73/645; 702/1; 702/127; 702/182; 702/187; 702/189; 708/200

(58) Field of Classification Search
CPC ........... G01D 7/00; G01D 9/00; G01D 21/00; G01H 1/00; G01H 17/00; G01R 23/00; G01R 31/00; G01R 31/08; G01R 31/26; G01R 31/27; G01R 2031/00; G06F 11/00; G06F 11/30; G06F 11/3058; G06F 11/32; G06F 11/34; G06F 11/70; G06F 17/40; G06F 19/00
USPC ............. 73/432.1, 570, 584, 645, 649, 865.8, 73/865.9; 181/125; 324/500, 511, 537, 324/763.01; 381/124; 702/1, 33, 35, 39, 56, 702/57, 58, 127, 182, 187, 189; 708/100, 708/105, 200; 714/1, 47.1, 100, E11.02, 714/E11.179
See application file for complete search history.

(56) References Cited

U.S. PATENT DOCUMENTS

| | | | | | |
|---|---|---|---|---|---|
| 3,416,630 | A | * | 12/1968 | Pohl et al. | 73/584 |
| 3,495,447 | A | * | 2/1970 | Conniff et al. | 73/773 |
| 4,965,513 | A | * | 10/1990 | Haynes et al. | 73/1.72 |

OTHER PUBLICATIONS

International Preliminary Report on Patentability received for PCT Application No. PCT/US2012/045025, mailed on Jan. 16, 2014, 6 pages.

\* cited by examiner

*Primary Examiner* — Edward Cosimano
(74) *Attorney, Agent, or Firm* — Jordan IP Law, LLC

(57) ABSTRACT

Systems and methods of identifying electrical sources of audible acoustic noise may involve identifying first frequency content of a circuit board, wherein the first frequency content is associated with at least one of acoustic noise and a vibration of the circuit board. Second frequency content of an electrical signal associated with the circuit board may also be identified. In addition, a coherence between the first frequency content and the second frequency content may be determined.

30 Claims, 3 Drawing Sheets

IDENTIFYING ELECTRICAL SOURCES OF ACOUSTIC NOISE

BACKGROUND

1. Technical Field

Embodiments generally relate to the design of electronic devices. More particularly, embodiments relate to the identification of acoustic noise sources in electronic devices.

2. Discussion

Electronic devices may include a wide variety of electrical and mechanical components interconnected by circuit boards, connectors and other physical structures. Audible acoustic noise may originate from any of these components, and identifying the sources of acoustic noise can be challenging. For example, analyzing acoustic test chamber sound field measurements may be time consuming, particularly when acoustic and vibration "hot spots" are not in the same location as the components that cause the noise and vibrations. Indeed, the underlying physics of the generation of acoustic noise by certain electrical components may not be fully understood, which can further complicate the analysis.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments may involve a computer implemented method in which first frequency content of a circuit board is identified, wherein the first frequency content is associated with at least one of acoustic noise and a physical characteristic of the circuit board. The method may also provide for identifying second frequency content of an electrical signal associated with the circuit board, and determining a coherence between the first frequency content and the second frequency content.

Embodiments may also include a computer readable storage medium having a set of instructions which, if executed by a processor, cause a computer to identify first frequency content of a circuit board, wherein the first frequency content is to be associated with a physical characteristic of the circuit board. The instructions can also cause a computer to identify second frequency content of an electrical signal associated with the circuit board, and determine a coherence between the first frequency content and the second frequency content.

In addition, embodiments can include a system having a measurement device and a processor. The system may also include a computer readable storage medium having a set of instructions which, if executed by the processor, cause the system to identify first frequency content based at least in part on data from the measurement device, wherein the first frequency content is to be associated with a physical characteristic of the circuit board. The instructions may also cause a computer to identify second frequency content of an electrical signal associated with the circuit board, and determine a coherence between the first frequency content and the second frequency content.

Other embodiments may involve a computer implemented method in which first frequency content of a circuit board is identified, wherein the first frequency content is associated with a physical characteristic of the circuit board. The method can also provide for identifying second frequency content of an electrical signal associated with the circuit board, wherein the second frequency content includes a power management switching frequency of the electrical signal, and one or more harmonic frequencies corresponding to the power management switching frequency. In addition, a coherence between the first frequency content and the second frequency content, wherein the coherence identifies one or more spectrum peaks in the second frequency content that correspond to one or more spectrum peaks in the first frequency content.

Figure 1:
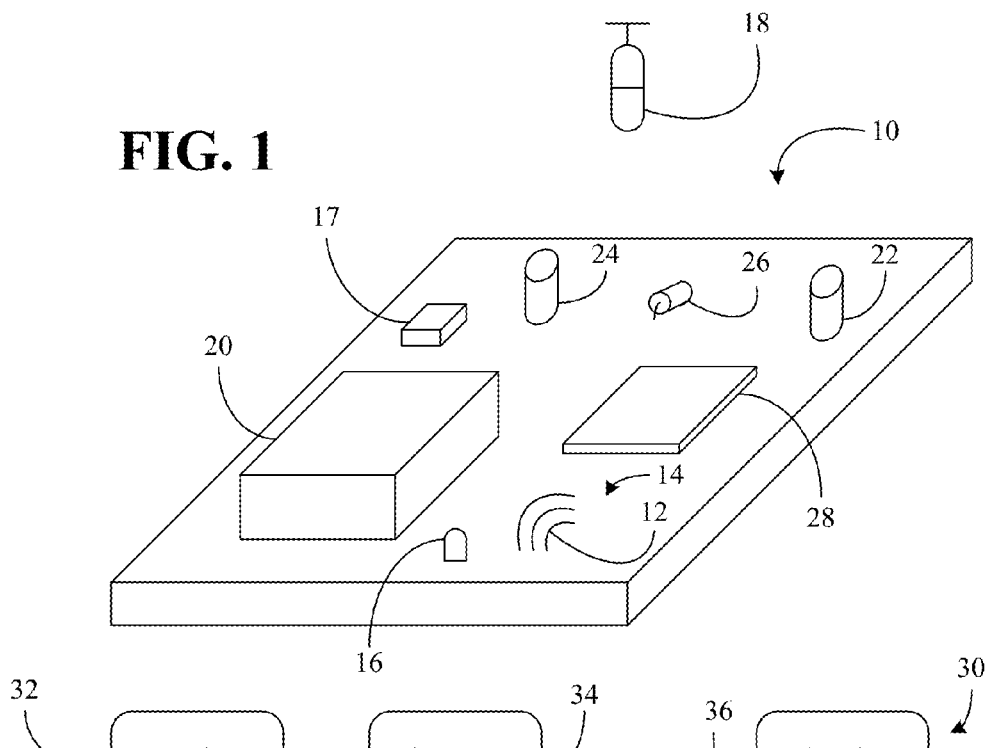
FIG. 1 is a perspective view of an example of a circuit board according to an embodiment.

Turning now to FIG. 1, a circuit board 10 is shown in which audible acoustic noise 12 emanates/radiates from the circuit board 10 at a "hot spot" location 14 during operation of the circuit board 10. The circuit board 10 might be installed in a mobile platform such as a laptop, personal digital assistant (PDA), wireless smart phone, media player, imaging device, mobile Internet device (MID), any smart device such as a smart phone, smart tablet, smart TV and so forth, or any combination thereof. The circuit board 10 may also be installed in a fixed platform such as a personal computer (PC), server, workstation, etc. One or several board-mounted accelerometers 17 may be used to measure one or more vibrations of the circuit board 10. In addition, a board-mounted microphone 16 and/or a board-external microphone 18 may be used to measure acoustic noise 12, wherein the source of the acoustic noise 12 and/or board vibrations are physical characteristics that can be identified even though the source may be mounted at the same or a different location on the circuit board 10, and even though other potential sources of the acoustic noise 12 and/or vibrations may also be mounted to the circuit board 10. For example, the acoustic noise 12 could be the result of vibrations from a mechanical device 20 such as a fan or a hard disk drive (HDD), the result of electrical signal voltage switching across an electrical component such as capacitors 22, 24, the result of electrical signal current switching through an inductor 26, and so forth.

In particular, the circuit board 10 might include one or more voltage rails that may undergo power management switching in order to conserve power. Thus, a given voltage rail that supplies an active component 28 might be periodically switched (e.g., at a rate of 1.5 kHz) between a normal voltage level of 5V and a sleep state voltage level of 1.2V to reduce power consumption, wherein if the capacitor 24 is coupled to the voltage rail, the switching may cause vibrations of the capacitor 24. Because the illustrated capacitor 24 is too small to function as an effective speaker, the capacitor vibrations can cause the substrate of the circuit board 10 to vibrate and output the sound waves at the hot spot location 14, particularly if the capacitor 24 is mounted tightly to the circuit board 10. The acoustic noise level can depend on the voltage signal, and similarly acoustic noise could result from current switching of electrical signals through the inductor 26.

As will be discussed in greater detail, a system may be used to identify the frequency content of the acoustic noise 12 and/or board vibrations, identify the frequency content of the electrical signals associated with the circuit board 10, and determine the coherence between the frequency content of the acoustic noise 12 and/or board vibrations, and the frequency content of the electrical signals. Accordingly, one or more of the electrical components mounted to the circuit board 10 may be positively identified as a source of the acoustic noise 12, even though they may be mounted at a different location than the local hot spot 14.

Figure 2:
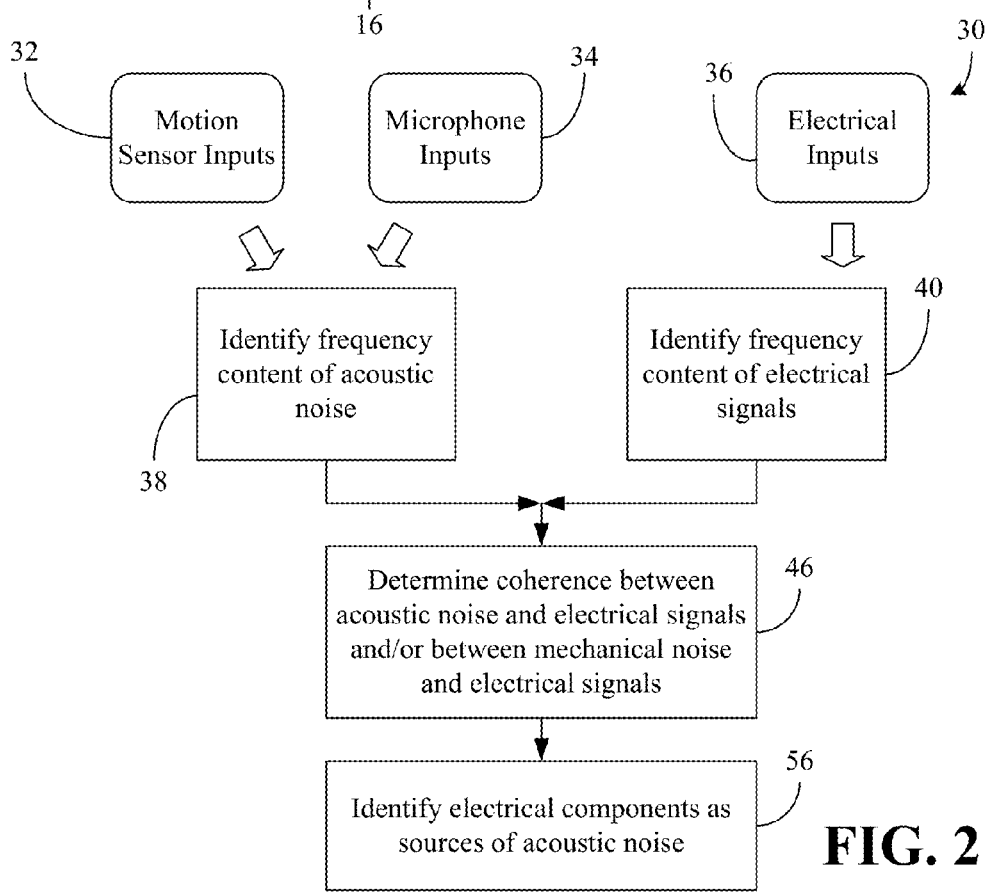
FIG. 2 is a flowchart of a method of an example of identifying electrical sources of acoustic noise according to an embodiment.

FIG. 2 shows a method 30 of identifying electrical sources of acoustic noise emanating from a circuit board. The method 30 may be implemented in a system as a set of executable logic instructions stored in a machine- or computer-readable storage medium such as random access memory (RAM), read only memory (ROM), programmable ROM (PROM), flash memory, firmware, microcode, etc., in fixed-functionality logic hardware using circuit technology such as application specific integrated circuit (ASIC), complementary metal oxide semiconductor (CMOS) or transistor-transistor logic (TTL) technology, or any combination thereof. For example, computer program code to carry out operations shown in the method 30 may be written in any combination of one or more programming languages, including an object oriented programming language such as C++ or the like and conventional procedural programming languages, such as the "C" programming language or similar programming languages. Moreover, various aspects of the method 30 could be implemented as embedded and/or programmable logic of one or more processors using any of the aforementioned circuit technologies.

Figure 3:
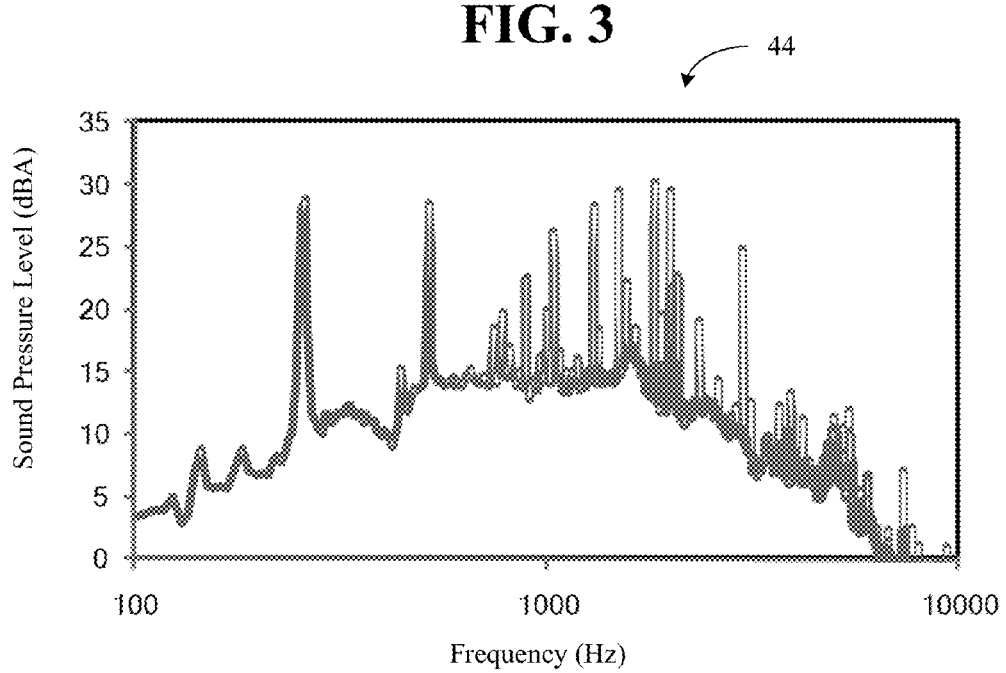
FIG. 3 is a plot of an example of an acoustic noise measurement according to an embodiment.

In general, motion sensor inputs 32, microphone inputs 34 and electrical inputs 36 may be used to isolate the frequency content of electrical signals from the frequency content of mechanical vibrations and/or the frequency content of the acoustic noise emanating from the circuit board. More particularly, the microphone inputs 34 may be obtained from devices such as microphones 16, 18 (FIG. 1) and the motion sensor inputs 32 may be obtained from devices such as the accelerometer 17 (FIG. 1), gyroscopes, etc., wherein the illustrated processing block 38 identifies the frequency content of the acoustic noise based on the microphone inputs 34 and/or motion sensor inputs 32. Thus, block 38 might involve generating a spectrum plot of the audio signals captured by the microphones. FIG. 3 shows a plot 44 that might be generated to reflect the frequency content of the acoustic noise.

Returning now to FIG. 2, block 40 may identify the frequency content of one or more electrical signals carried on the circuit board. Accordingly, the electrical inputs 36 might include an identification of the various voltage rails present on the circuit board, the power management switching state of the voltage rails, and perhaps an identification of the electrical components coupled to the voltage rails. For example, one or more signals representing information such as the information in Table I below could be used as the electrical inputs 36.

TABLE I

| Rail | PM switching frequency | Switching mode | Source components | Active components |
|---|---|---|---|---|
| V1 | 1.5 kHz | voltage | C1, C2 | Main Processor, core 1 |
| V2 | 2.0 kHz | current | L1, L2 | Graphics Processor |
| V3 | none | none | C3 | Main Processor, core 2 |
| V4 | none | none | C4 | Network Controller |

Thus, the electrical signal frequency content could include the power management switching frequency of each voltage rail as well as the associated harmonic frequencies of each power management switching frequency. Block 40 may therefore output an electrical frequency spectrum having a few distinct peaks at a base frequency (e.g., 1.5 kHz) and its higher harmonics (e.g., 3.0 kHz, 4.5 kHz, etc.). The motion sensor inputs 32 and microphone inputs 34 may capture vibrations/acoustic noise originating from mechanical devices such as fans and HDDs, as well as vibrations/acoustic noise originating from electronic components mounted to the circuit board.

Figure 4:
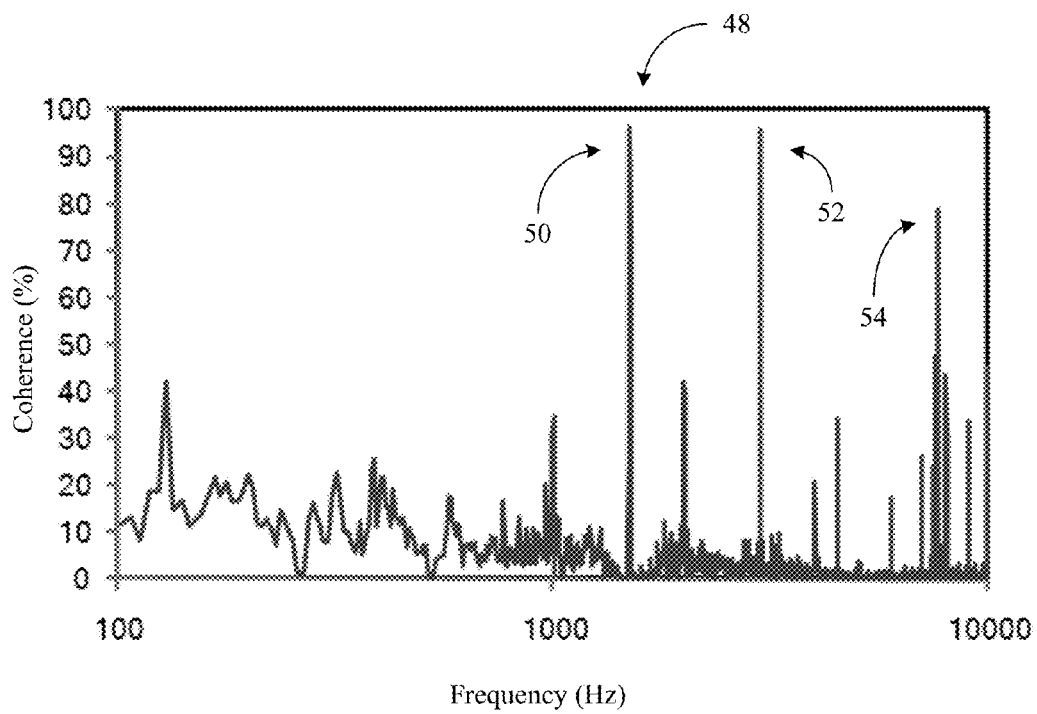
FIG. 4 is a plot of an example of acoustic noise coherence analysis results according to an embodiment.

Block 46 may provide for determining the coherence between the acoustic noise and the electrical signals, and/or between the circuit board vibrations and the electrical signals. In particular, the coherence determination may involve identifying one or more spectrum peaks in frequency content of each electrical signal that correspond to one or more spectrum peaks in the frequency content of the acoustic noise and/or vibration spectra. FIG. 4 shows a plot 48 for coherence between an electrical signal and an acoustic signal, where the base frequency peak 50 and higher harmonic frequency peaks 52, 54 can be determined.

Returning now to FIG. 2, illustrated block 56 provides for identifying one or more electrical components as a source of the acoustic noise based on the coherence analysis. In particular, if it is determined that a particular electrical signal has a high correlation with the acoustic noise or the mechanical board vibration(s), the voltage rail corresponding to that electrical signal and one or more electrical components coupled to the voltage rail may be identified as sources of the acoustic noise. As already noted, the electrical components could include capacitors and/or inductors that experience vibrations due to periodic voltage and/or current swings in the electrical signal.

Figure 5:
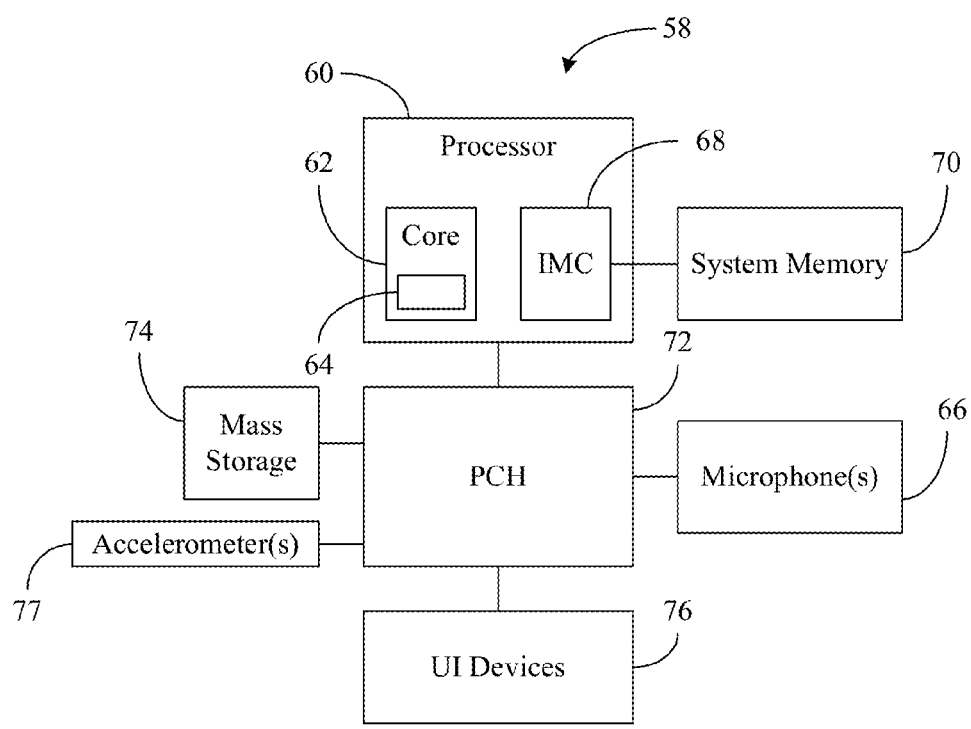
FIG. 5 is a block diagram of an example of a system according to an embodiment.

FIG. 5 shows a computing system 58 that may be used to evaluate a circuit board such as the circuit board 10 (FIG. 1), discussed above. The computing system 58 could be part of a mobile platform such as a laptop, PDA, wireless smart phone, media player, imaging device, MID, any smart device such as a smart phone, smart tablet, smart TV and so forth, or any combination thereof. The computing platform 58 may also be part of a fixed platform such as a personal computer (PC), server, workstation, etc. In the illustrated example, one or more microphones 66 sense audible acoustic noise emanating from a circuit board as a physical characteristic of the circuit board, and a processor 60 includes one or more cores 62 capable of running logic 64 configured to identify first frequency content of the acoustic noise. The logic 64 may also be configured to identify second frequency content of an electrical signal associated with the circuit board, and determine coherence between the first frequency content and the second frequency content.

Additionally, the logic 64 may be configured to use one or more accelerometers 77 to identify the first frequency content of one or more vibrations of the circuit board, wherein the circuit board vibrations can also be considered a physical characteristic of the circuit board. In one example, the coherence identifies one or more spectrum peaks in the second frequency content that correspond to one or more spectrum peaks in the first frequency content. Although the logic 64 is illustrated as executing on a signal processor core 62, the logic 64 may also be distributed across multiple cores and/or multiple processors. For example, a coherence processor might be used to determine the electrical noise spectrum.

The illustrated processor 60 also includes an integrated memory controller (IMC) 68 configured to communicate with system memory 70. The system memory 70 may include, for example, dynamic random access memory (DRAM) configured as a memory module such as, for example, a dual inline memory module (DIMM), a small outline DIMM (SODIMM), etc. The computing system 58 may also include a platform controller hub (PCH) 72, sometimes referred to as a Southbridge of a chipset, that functions as a host device and may communicate with the microphones 66, mass storage 74 (e.g., HDD, optical disk, flash memory, programmable read only memory/PROM), and various user interface (UI) devices 76 (e.g., touch screen, liquid crystal display/LCD, light emitting diode/LED, keyboard, mouse, etc.). The UI devices 76 may be capable of enabling a user to interact with and perceive information from the computing system 58.

Thus, the techniques described herein can enable the root cause of audible acoustic noise to be pinpointed in electrical systems having numerous electrical and mechanical components. Moreover, the above approaches may significantly reduce troubleshooting uncertainty because trial and error "guessing" techniques can be avoided. Accordingly, system design costs and production/development cycles may in turn be reduced.

Embodiments of the present invention are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. are used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A computer implemented method comprising:
   identifying a first frequency content of a circuit board, wherein the first frequency content is associated with a physical characteristic of the circuit board;
   identifying second frequency content of an electrical signal associated with the circuit board, wherein the second frequency content includes a power management switching frequency of the electrical signal, and one or more harmonic frequencies corresponding to the power management switching frequency; and
   determining a coherence between the first frequency content and the second frequency content, wherein the coherence identifies one or more spectrum peaks in the second frequency content that correspond to one or more spectrum peaks in the first frequency content.

2. The method of claim 1, further including:
   identifying a voltage rail associated with the electrical signal; and
   identifying an electrical component associated with the voltage rail as a source of the first frequency content.

3. The method of claim 1, further including using a motion sensing device to sense one or more vibrations of the circuit board, wherein the first frequency content is identified based at least in part on the one or more vibrations.

4. The method of claim 1, further including using a microphone to sense acoustic noise from the circuit board, wherein the first frequency content is identified based at least in part on the acoustic noise.

5. The method of claim 4, wherein at least one of a board-mounted microphone and a board-external microphone are used to sense the acoustic noise.

6. The method of claim 4, wherein the acoustic noise emanates from a different location on the circuit board than a mounting location of an electrical source of the first frequency content.

7. A computer readable storage medium comprising a set of instructions which, if executed by a processor, cause a computer to:
   identify first frequency content of a circuit board, wherein the first frequency content is to be associated with a physical characteristic of the circuit board;
   identify second frequency content of an electrical signal associated with the circuit board; and
   determine a coherence between the first frequency content and the second frequency content.

8. The medium of claim 7, wherein the instructions, if executed, cause a computer to:
   determine a power management switching frequency of the electrical signal; and
   determine one or more harmonic frequencies corresponding to the power management switching frequency, wherein the second frequency content is to include the power management switching frequency and the one or more harmonic frequencies.

9. The medium of claim 7, wherein the coherence is to identify one or more spectrum peaks in the second frequency content that correspond to one or more spectrum peaks in the first frequency content.

10. The medium of claim 7, wherein the instructions, if executed, cause a computer to:
identify a voltage rail associated with the electrical signal; and
identify an electrical component associated with the voltage rail as a source of the first frequency content.

11. The medium of claim 7, wherein the instructions, if executed, cause a computer to use a microphone to sense acoustic noise from the circuit board, wherein the first frequency content is to be identified based at least in part on the acoustic noise.

12. The medium of claim 11, wherein at least one of a board-mounted microphone and a board-external microphone are to be used to sense the acoustic noise.

13. The medium of claim 11, wherein the acoustic noise is to emanate from a different location on the circuit board than a mounting location of an electrical source of the first frequency content.

14. The medium of claim 11, wherein the instructions, if executed, cause a computer to use a motion sensing device to sense one or more vibrations of the circuit board, wherein the first frequency content is to be identified based at least in part on the one or more vibrations.

15. A system comprising:
a measurement device;
a processor; and
a computer readable storage medium including a set of instructions which, if executed by the processor, cause the system to,
identify first frequency content of a circuit board based at least in part on data from the measurement device, wherein the first frequency content is to be associated with a physical characteristic of the circuit board,
identify second frequency content of an electrical signal associated with the circuit board, and
determine a coherence between the first frequency content and the second frequency content.

16. The system of claim 15, wherein the instructions, if executed, cause the system to:
determine a power management switching frequency of the electrical signal, and
determine one or more harmonic frequencies corresponding to the power management switching frequency, wherein the second frequency content is to include the power management switching frequency and the one or more harmonic frequencies.

17. The system of claim 15, wherein the coherence is to identify one or more spectrum peaks in the second frequency content that correspond to one or more spectrum peaks in the first frequency content.

18. The system of claim 15, wherein the instructions, if executed, cause the system to:
identify a voltage rail associated with the electrical signal, and
identify an electrical component associated with the voltage rail as a source of the first frequency content.

19. The system of claim 15, wherein the measurement device includes a motion sensing device and the instructions, if executed, cause the system to use the motion sensing device to sense one or more vibrations of the circuit board, wherein the first frequency content is to be identified based at least in part on the one or more vibrations.

20. The system of claim 15, wherein the measurement device includes a microphone and the instructions, if executed, cause the system to use the microphone to sense acoustic noise from the circuit board, wherein the first frequency content is to be identified based at least in part on the acoustic noise.

21. The system of claim 20, wherein the microphone includes at least one of a board-mounted microphone and a board-external microphone.

22. The system of claim 20, wherein the acoustic noise is to emanate from a different location on the circuit board than a mounting location of an electrical source of the first frequency content.

23. A computer implemented method comprising:
identifying a first frequency content of a circuit board, wherein the first frequency content is associated with a physical characteristic of the circuit board;
identifying second frequency content of an electrical signal associated with the circuit board; and
determining a coherence between the first frequency content and the second frequency content.

24. The method of claim 23, further including:
determining a power management switching frequency of the electrical signal; and
determining one or more harmonic frequencies corresponding to the power management switching frequency, wherein the second frequency content includes the power management switching frequency and the one or more harmonic frequencies.

25. The method of claim 23, wherein the coherence identifies one or more spectrum peaks in the second frequency content that correspond to one or more spectrum peaks in the first frequency content.

26. The method of claim 23, further including:
identifying a voltage rail associated with the electrical signal; and
identifying an electrical component associated with the voltage rail as a source of the first frequency content.

27. The method of claim 23, further including using a motion sensing device to sense one or more vibrations of the circuit board, wherein the first frequency content is identified based at least in part on the one or more vibrations.

28. The method of claim 23, further including using a microphone to sense acoustic noise from the circuit board, wherein the first frequency content is identified based at least in part on the acoustic noise.

29. The method of claim 28, wherein at least one of a board-mounted microphone and a board-external microphone are used to sense the acoustic noise.

30. The method of claim 28, wherein the acoustic noise emanates from a different location on the circuit board than a mounting location of an electrical source of the first frequency content.

* * * * *

UNITED STATES PATENT AND TRADEMARK OFFICE
CERTIFICATE OF CORRECTION

PATENT NO. : 8,892,374 B2
APPLICATION NO. : 13/175269
DATED : November 18, 2014
INVENTOR(S) : Jessica Gullbrand et al.

It is certified that error appears in the above-identified patent and that said Letters Patent is hereby corrected as shown below:

On the Title page, Item (75), in column 1, in "Inventors", line 5, delete "Tiaquepaque" and insert -- Tlaquepaque --, therefor.

Signed and Sealed this
Fifth Day of May, 2015

Michelle K. Lee
*Director of the United States Patent and Trademark Office*